219-121 SR
MTR09 XR 3,634,927

United States Patent

[15] 3,634,927
[45] Jan. 18, 1972

Neale et al.

[54] METHOD OF SELECTIVE WIRING OF INTEGRATED ELECTRONIC CIRCUITS AND THE ARTICLE FORMED THEREBY

[72] Inventors: Ronald G. Neale, Birmingham; Stanford R. Ovshinsky, Bloomfield Hills, both of Mich.
[73] Assignee: Energy Conversion Devices, Inc., Troy, Mich.

[22] Filed: Nov. 29, 1968
[21] Appl. No.: 779,674

[52] U.S. Cl. ....29/576, 29/584, 29/620, 29/624, 340/173
[51] Int. Cl. ....B01j 17/00, H01l 7/00
[58] Field of Search ....29/584, 585, 586, 577; 317/234, 235; 340/173 NR

[56] References Cited

UNITED STATES PATENTS

| | | | |
|---|---|---|---|
| 3,423,646 | 1/1969 | Cubert et al. | 317/235 T |
| 3,549,432 | 12/1970 | Sivertsen | 317/235 AL |
| 3,077,578 | 2/1963 | Kingston et al. | 317/234 (10) |
| 3,390,012 | 6/1968 | Haberecht | 29/584 |
| 3,395,446 | 8/1968 | Jensen | 317/234 (10) |

*Primary Examiner*—John F. Campbell
*Assistant Examiner*—W. Tupman
*Attorney*—Walenstein, Spangenberg, Hattis & Strampel and Edward G. Fiorito, Esq.

[57] ABSTRACT

A method, and the article formed thereby, of selective wiring of integrated electronic circuits. A substrate is provided for receiving the plurality of electronic components. A layer of semiconductor material is applied over the substrate and electronic components, and the semiconductor material is preferably of a substantially disordered and generally amorphous type capable of selective alternate conditions between high-resistance blocking condition and a low-resistance conducting condition. Discrete continuous portions of the semiconductor material are energized to alter the material from the state of high resistance to the state of low resistance to form conductive paths within the semiconductor material to interconnect the several components on the substrate.

17 Claims, 9 Drawing Figures

Inventors
Ronald G. Neale
Stanford R. Ovshinsky
By: Wallenstein, Spangenberg, Hattis & Strampel Atty Inventors
Ronald G. Neale
Stanford R. Ovshinsky
By: Wallenstein, Spangenberg, Hattis & Strampel att'ys

METHOD OF SELECTIVE WIRING OF INTEGRATED ELECTRONIC CIRCUITS AND THE ARTICLE FORMED THEREBY

This invention relates generally to integrated electronic circuits and more particularly to selective wiring of the several components formed on a substrate.

Heretofore, one method used to interconnect the different components located on an integrated circuit chip has been to evaporate over the upper surface of the chip a layer of aluminum or other conductive material and by suitable etching and photolithographic processes produce the interconnection pattern necessary. For example, that method may incorporate the use of a photographic plate to form a mask which is used to form a particular interconnection pattern for a large number of components in the integrated circuit, the process being repeated for each different circuit chip. That method is widely used to form interconnections between plural transistors on a given chip. However, in the event of a failure of one of the transistors, the entire circuit is rejected. In producing plural transistors on a chip, it is not difficult to obtain chip yields of 50 to 80 percent when producing small-size circuits. That is, 50 to 80 percent of the transistors on the chip are of usable quality. This percent of yield is acceptable for production under most circumstances.

When considering large-scale integration or systems on a chip or slice, failure or poor quality of a single component on the chip may be considered unacceptable. To circumvent this undesirable condition a number of techniques have been devised which allow large-scale integration to be used to fabricate acceptable chip components even though some of the individual components are not of usable quality. The basic concept of this method is to duplicate or triplicate those components which have low yields. Each component is evaluated by probing and thereafter the interconnections are made only to those components that meet the required tolerance. One it is known which of the components are usable, their exact location determined,, means are provided to evaluate the best interconnection pattern for that particular chip. This is usually achieved by the use of a computer which receives the testing or probing information and subsequently controls the movement of an X-Y coordinate table to effect the interconnection of the components. As the coordinate table is moved a narrow beam of light is projected onto the plate and the mask pattern is thereby generated. This mask is then used to etch the necessary conductive interconnection pattern between the usable components on the chip. Because of the large number of possible combinations of conductive patterns, this method requires a new mask for each individual chip which is produced.

Another method to interconnect the various components on a chip is to use the computer and the X-Y coordinate table in combination with a laser beam which, in turn, is used to reevaporate aluminum onto the surface of the chip. The aluminum so deposited then forms the conductors for interconnection of the several components. The disadvantage in each of the above-mentioned prior art systems is that a new mask, or a new glass plate, is required for each individual chip.

Accordingly, one of the objects of this invention is to provide a novel method whereby a new mask or glass plate is not required for the selective interconnection of individual complex integrated circuit chips.

Another object of this invention is to provide a novel method of interconnecting the several electronic components on a substrate in such a manner that the interconnections on the substrate can be changed to alter the circuit from one configuration to another or to repair broken connections between components.

Briefly, this invention contemplates the use of an amorphous semiconductor film which is applied to the substrate and overlies the several components formed thereon. Means are used for energizing discrete continuous lengths of the semiconductor material to form a conductive path through the material. The discrete continuous conductive paths are predetermined to form the interconnection pattern on a particular chip. This invention makes use of a substantially disordered and generally amorphous semiconductor material of high resistance, selected portions of which are capable of being altered from a stable condition of high resistance to a stable condition of low resistance by application of energy thereto. The conducting path or paths may be realtered to substantially the original condition of high resistance by applying energy which resets the same. The energy is preferably in the form of a beam applied along discrete continuous paths on the surface of the film which changes the substantially disordered and generally amorphous high resistance material contacted by the beam to a state of low resistance so that a conductor is formed.

The above and other objects, features and advantages of this invention will be more fully realized and understood from the following detailed description when taken in conjunction with the accompanying drawings wherein like reference numerals throughout the various views of the drawings are intended to designate similar elements or components.

Figure 1:
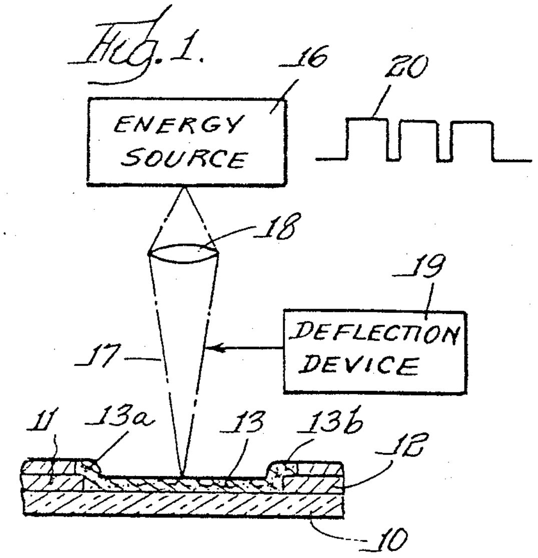
FIG. 1 illustrates diagrammatically a method of selective wiring of integrated circuits as contemplated by this invention.
Figure 2:
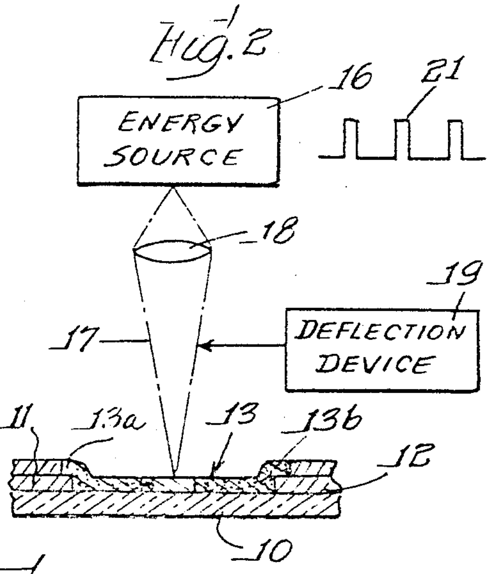
FIG. 2 is a diagrammatic representation of a method for repairing integrated electronic circuits in accordance with the principles of this invention.

Referring now to FIGS. 1 and 2 there is shown a substrate 10 of electrically insulating material upon which electronic components are formed. By way of example, a pair of resistors 11 and 12 are formed on the substrate at different locations to be electrically connected by the method of this invention.

A layer or film 13 of semiconductor material is deposited on the substrate 10 to overlie the substrate and the resistors 11 and 12. The layer 13 of semiconductor material is capable of having discrete portions thereof reversibly altered between a substantially disordered generally amorphous condition of high resistance and a more ordered condition of low resistance. The semiconductor material of the layer 13 is a polymeric material which, in a stable manner, may be in either of two possible states or conditions, and a large number of different compositions of material may be utilized to form the material. As for example, the semiconductor material may comprise tellurium and germanium at about 85 percent tellurium and 15 percent germanium in atom percent with inclusions of some oxygen and/or sulfur. Other compositions may comprise $Ge_{75}As_{15}Se_{10}$. Further compositions which are also effective in accordance with this invention may consist of the memory materials disclosed in U.S. Pat. No. 3,271,591 issued Sept. 6, 1966. Such materials are referred to therein in connection with memory devices such as "Hi-Lo, Circuit Breaker and Mechanism devices with memory." In manufacture, the constituents of the semiconductor material 13 may be heated in a closed vessel and agitated for homogeneity and then cooled into an ingot. The film or layer 13 may be formed on the substrate 10 by components of the ingot by vacuum deposition or sputtering or the like.

After the film or layer 13 is applied to the substrate 10 and components 11 and 12, they are positioned in proximity to an energy source 16 which directs an energy beam 17 to impinge upon the surface of the semiconductor material 13. The energy beam 17 may be a high-energy electron beam or a laser beam. A focusing device 18 may be provided to focus the beam 17 to a narrow impingement point at the surface of the film 13. A deflection device 19 may be provided to effect movement of the beam 17 in a predetermined pattern. Impingement of the energy beam 17 on the semiconductor material 13 causes the semiconductor material to alter from its substantially disordered generally amorphous condition of high resistance to a condition of low resistance where it is thought that the local order and/or localized bonding of the material is altered by the effect of the energy beam applied thereto to cause this low-resistance condition to occur and remain frozen in the material. The altered portions of the material may be considered to be more ordered than the remainder of the substantially disordered generally amorphous material. This conversion of conductive characteristics results only in the area of semiconductor material immediately under the energy beam 17. Therefore, as the energy beam 17 is deflected from one side to the other under the influence of the deflection device 19, a discrete elemental length of the semiconductor material will form a conductive path between the resistors 11 and 12. This discrete elemental length is indicated as the portion of the material between the points indicated at 13*a* and 13*b* as seen in FIGS. 1 and 2.

The preferred form of beam energy is that of modulated beam pulses of relatively long duration as indicated by reference numeral 20 of FIG. 1. The wider pulses of beam energy induce heat within the semiconductor material only in the region receiving the energy beam. This increase in temperature, among other things, cause the material, along the path followed by the beam to assume the low-resistance conductive condition. The pulses of beam energy are applied for a sufficient period of time to allow the change in conductivity to be frozen in, for example, a millisecond or so. It will be understood that the movement of the beam is sufficiently slow to ensure overlap of beam pulses applied to the surface of the semiconductor material thereby ensuring a continuous conductive path or paths.

If it becomes necessary to alter the condition of the semiconductor material from the low-resistance conducting condition to the high-resistance blocking condition, pulses of beam energy of relatively short duration are applied to the semiconductor material, as indicated by reference numeral 21 of FIG. 2. The pulses 21 of beam energy are applied to the semiconductor material for a relatively short period of time, as for example, a nanosecond or so, for heating the material. Since the pulses of beam energy are of relatively short durations and the pulses are spaced relatively far apart, there is adequate time between pulses for the heated portion of the semiconductor material to rapidly cool and upon such rapid cooling revert to the substantially disordered generally amorphous condition of high blocking resistance. Therefore, integrated electronic circuits constructed by this method can be easily repaired or altered in configuration.

Figure 3:
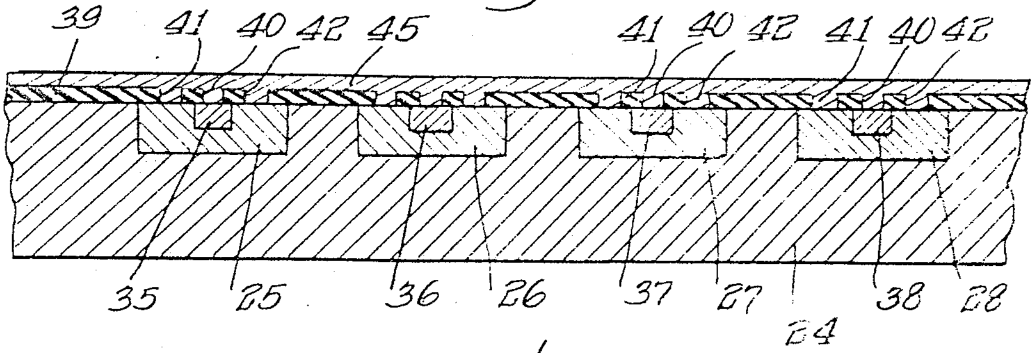
FIG. 3 is an elevational sectional view of a portion of a multiple-transistor integrated circuit which is made by the method of this invention.
Figure 4:
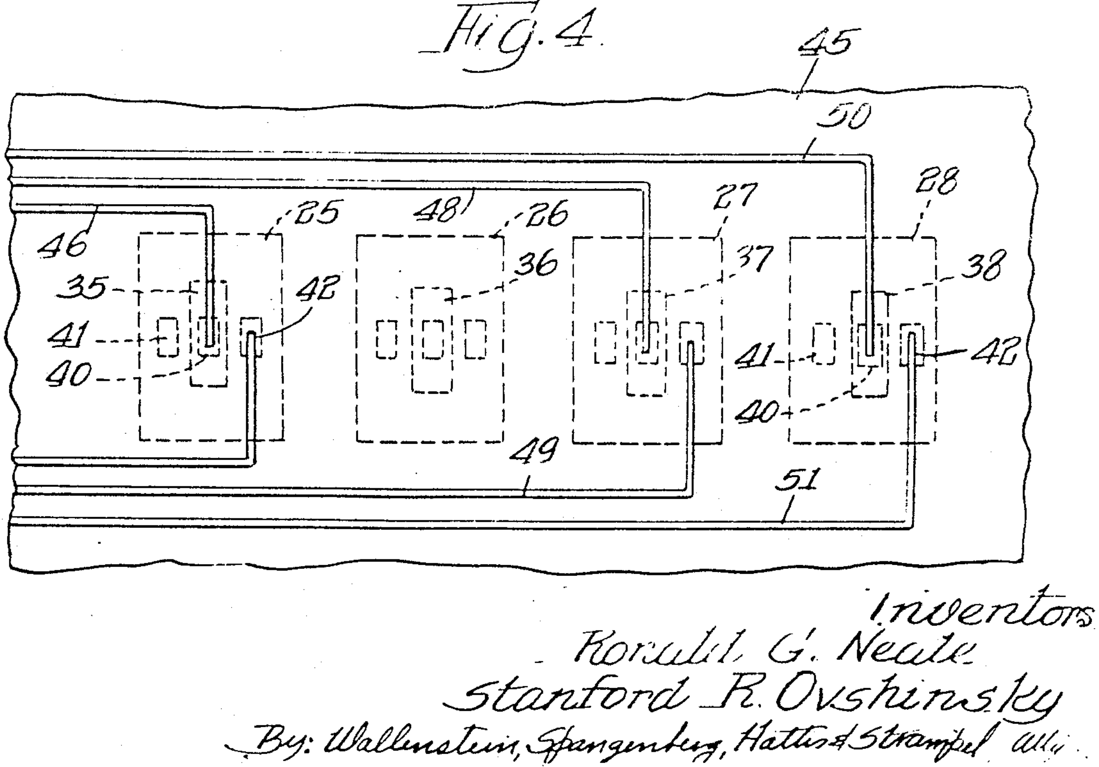
FIG. 4 is a top plan view of the integrated circuit of FIG. 3.

Referring now to the FIGS. 3 and 4, there is shown a fragment of a chip or slice which constitutes a portion of an integrated electronic circuit including a plurality of transistors of conventional construction. Here, a substrate 24 of electrical conductive material forms a common collector for the plurality of transistors, it being of one conductivity type, as for example, P-type material. Formed in the common collector are a plurality of bases 25, 26, 27 and 28 of opposite conductivity type, for example, N-type material, there being PN-junctions therebetween. Formed in each base 25, 26, 27 and 28 is an emitter 35, 36, 37 and 38 of opposite conductivity as for example, P-type material, there being PN junctures therebetween. An insulator layer 39 is positioned over the substrate 24 at the surface forming the transistors. The insulator layer 39 has apertures 40 in registry with the emitters 35 and pairs of apertures 41 and 42 in registry with the bases 25 on opposite sides of the emitters.

A layer or film 45 of the aforementioned semiconductor material is applied over the insulator layer 39, the semiconductor material 45 being applied in such a manner as to fill the apertures 40, 41 and 42 formed in the insulator layer so as to be in contact with the bases 25, 26, 27 and 28 and the emitters 35, 36, 37 and 38.

When the method of this invention is used in the manufacture of large-scale integrated circuit systems which produce slice yields of less than 100 percent, the various transistors are tested by probing before the semiconductor material layer 45 is applied. After the determination of which transistors on the substrate are suitable for use, the semiconductor material 45 is applied and the chip or slice is placed in suitable apparatus for directing beam energy to the surface of the semiconductor material. For example, after probing if it were determined that transistor 24, 26, 36 is defective, only the other transistors shown on the drawing would be wired into a circuit arrangement.

A source of beam energy, as shown in FIGS. 1 and 2, would convert discrete elemental lengths of the semiconductor material 42 from the substantially disordered generally amorphous state of high resistance to the condition of low resistance. For example, discrete conductive paths 46 and 47 may be created for connection to the emitter 35 and the base 25, respectively. The discrete conductive path 46 terminates in the aperture 40 so as to provide electrical connection to the emitter 35. Similarly, the discrete elemental length 47 terminates in the aperture 42 for connection to the base 25, and it will be understood that the conductive path 47 may be, as an alternative, connected to the base 25 through the aperture 41. In like manner, discrete elemental lengths forming conductive paths 48 and 49 are connected to transistor emitter 37 and base 27 and discrete elemental lengths forming conductive paths 50 and 51 are connected to transistor emitter 38 and base 28.

The method of forming integrated electronic circuits according to this invention not only has the advantage of facilitating repair of circuits but additionally enables the circuit configuration to be altered at some further time. For example, transistor 24, 26, 36 may have proven to be of usable quality and is, therefore, considered a spare component on the chip. If one of the other transistors fails, the chip can be easily rewired to utilize the extra good transistor.

Figure 5:
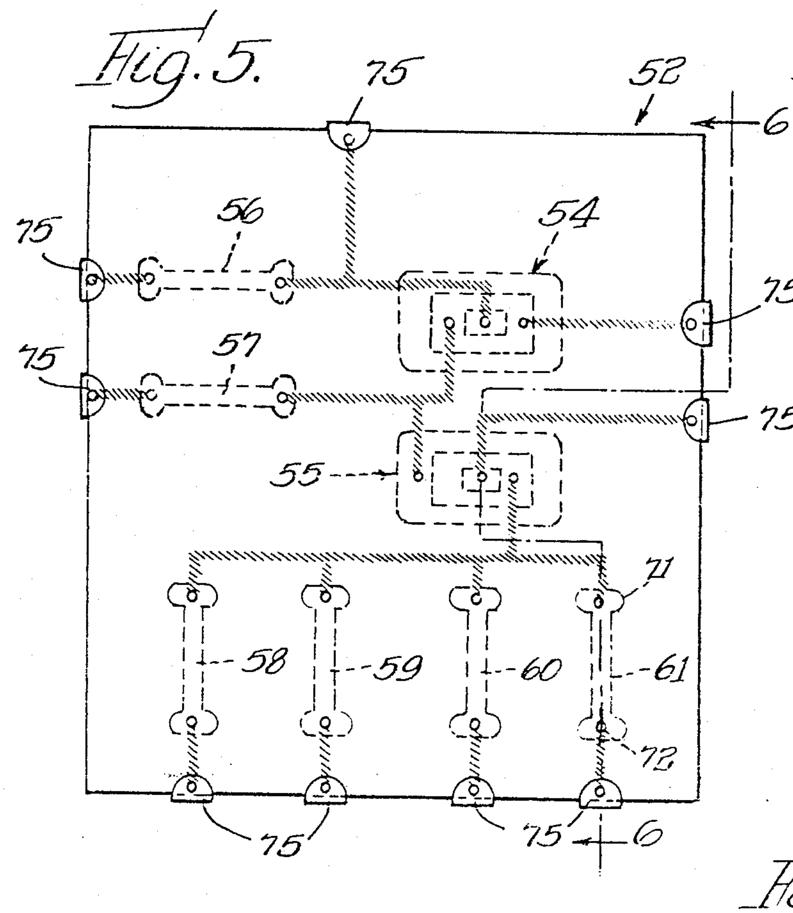
FIG. 5 is a top plan view illustrating the construction of a resistor-transistor logic which is constructed by using the principle of this invention.
Figure 6:
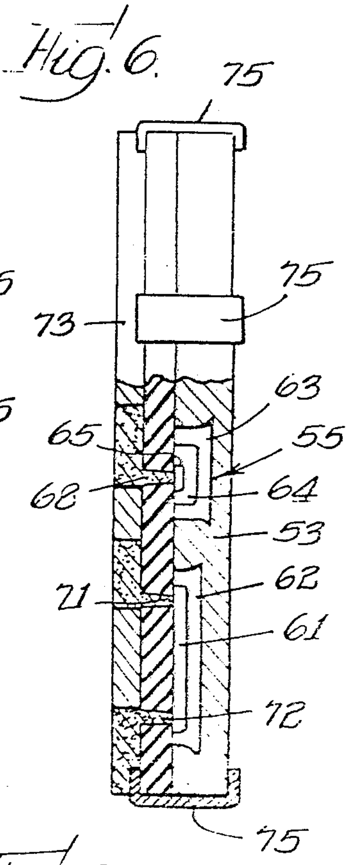
FIG. 6 is an edge view of the resistor-transistor logic of FIG. 5 taken along line VI—VI of FIG. 5.

Referring now to FIGS. 5 and 6 there is shown, by way of example, the construction of a resistor-transistor logic circuit indicated generally by reference numeral 52. A substrate 53 of semiconductor or electrically nonconductive material has formed thereon a pair of transistor 54 and 55 and a plurality of resistors 56, 57, 58, 60 and 61.

The substrate 53 may be of a silicon compound of substantially nonconductive material and by proper doping, as is well known in the art, a collector 63 may be formed at a particular position on the substrate 53. Formed within the collector 63 is a base 64 having a conductivity type opposite that of the collector. Finally, an emitter 65 is formed on or within the base 64 thereby completing the construction of the transistor as an integral part of the substrate 53. Transistor 54 is preferably constructed in like manner. The resistor 56–61 may be formed by doping the desired areas on the substrate 53 with the appropriate dopant which, when combined with the material of the substrate, produce the resistors as is well known in the art and which may include an isolation region 62 between each resistor and the substrate 53 as seen in FIG. 6. An insulator 66 is positioned over the substrate 53 and include apertures which are in registry with selected points on the several components formed on the substrate. For example, an aperture 68 is in registry with the emitter 65 of transistor 55 and a pair of apertures 71 and 72 are in registry with the ends of the resistor 61.

After the components have been formed on the substrate 53 and the insulator 66 placed over the components, a layer 73 of semiconductor material is applied over the insulator 66 in such a manner to fill the apertures formed therein to be in contact with the component directly beneath the aperture. The semiconductor material 73, as mentioned hereinabove, is of the type capable of selective alternate conditions between a substantially disordered generally amorphous condition of high resistance and a condition of low resistance. When beam energy is traversed across the surface of the semiconductor material 73 along a predetermined path, the electrical interconnections between the components on the substrate are formed by the high-conductivity filament which is created through the semiconductor material 73 as indicated by the shaded lines of FIG. 5 and by the shaded area through the semiconductor material 73 of FIG. 6. A plurality of terminals 75 may be strategically located about the periphery of the substrate 53 to provide electrical terminals suitable for soldering or the like.

Figure 7:
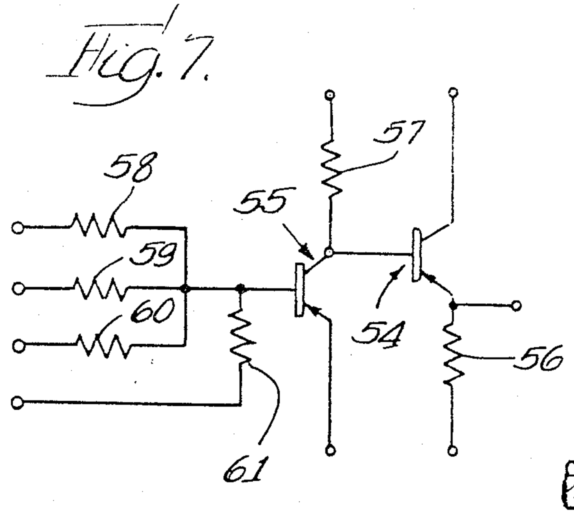
FIG. 7 is a schematic representation of the circuit construction shown in FIG. 5.

Seen in FIG. 7 is a schematic representation of the integrated electronic circuit of FIGS. 5 and 6. According it will come to the mind of the artisan that the components shown in FIG. 7 can be electrically arranged in several different ways to form different circuits by using some or all of the same components on a chip. This novel advantage enables a large quantity of chips to be formed with a given number and kind of components and the circuit arrangement desired can be obtained by selecting or reselecting the necessary conductive paths through the semiconductor material 73.

Figure 8:
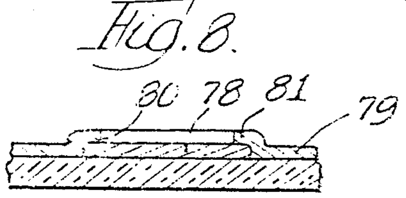
FIGS. 8 and 9 illustrate a method of producing resistors of different ohmic value while using the same resistor body.
Figure 9:
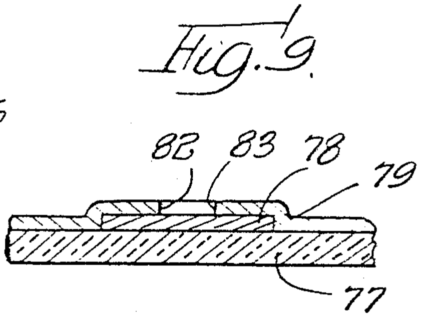

Another advantage realized by this invention is the ability of selecting the desired electrical characteristic of a particular component. This feature is illustrated in the FIGS. 8 and 9 which show a substrate 77 for receiving a resistor 78 deposited thereon. In this instance, the substrate 77 is preferably of nonconductive material. A layer of film 79 of semiconductor material is deposited on the substrate and over the resistor. The resistor 78 has a known resistance value gradient from point to point along the body thereof. Therefore, if probes are placed on the resistor, the resistance value, in ohms, is determined by the distance between the probes. Therefore, if the layer 79 of semiconductor material forms conductive paths which are separated by the spacing indicated by reference numeral 80 and 81, the resistor FIG. 8 will have a relatively high resistance value. On the other hand, if the termination of the conductive paths through the semiconductor material 79 are placed closer to one another, as indicated by reference numerals 82 and 83, of FIG. 9, the resistor will have a relatively low resistance value.

Although this invention is shown used with a monolithic circuit structure it will be understood that this invention can be used for selective wiring of integrated circuits made by the "-compatible" technique, and that variations and modifications may be effected without departing from the spirit and scope of the novel concepts of this invention.

We claim:

1. A method of forming electrical connections for a plurality of circuit components, said method comprising the steps of: providing a base with spaced conductive areas exposed on one side thereof which spaced conductive areas are points of an electrical circuit to include said circuit components whose terminals are to be electrically interconnected by connections between said spaced conductive areas; depositing on said base over and between said spaced conductive areas a film of memory semiconductor material in an initial substantially disordered generally amorphous condition of high resistance, said memory semiconductor material being resettably alterable from said initial substantially disordered generally amorphous condition of high resistance to a stable condition of much lower resistance and altered structural state by the momentary impingement on the outer side thereof of external energy having a given material-setting characteristic and resettable back to said stable condition of high resistance by the momentary impingement on said outer side thereof of external energy having a given material-resetting characteristic, the condition of much lower resistance and reset condition of high resistance persisting indefinitely after the said application of said energy is terminated, and altering only selected continuous portions of said memory semiconductor material between selected ones of the conductive areas to said stable condition of much lower resistance which low-resistance condition extends completely through said film of memory semiconductor material at least over said spaced conductive areas therebeneath, leaving unaltered other portions thereof, by the controlled selective application of said external energy to said outer side of said memory semiconductor material having said given material-setting characteristic of a magnitude which does not destroy the integrity of the memory semiconductor material thereat, to form discrete conductive paths between said spaced conductive areas.

2. The method of claim 1 wherein said energy applied to said memory semiconductor material between said circuit points is in the form of a beam of energy impinging upon said material between said circuit points.

3. The method of claim 2 wherein said energy having said given material-setting characteristic is a beam of energy applied to a point of the memory semiconductor material for a relatively long duration, said energy having said given material-resetting characteristic is a beam of energy applied to a point of the memory semiconductor material for a relatively short duration.

4. The method of claim 2 wherein said beam is an electron beam.

5. The method of claim 2 wherein said beam is a light beam.

6. The method of claim 2 wherein said base supports said components and there are a number of pairs of spaced conductive areas on said one side of said base which pairs of spaced conductive areas are connected with pairs of said circuit components to be interconnected, said memory semiconductor material bridging said respective pairs of spaced conductive areas, and said energy being applied to said memory semiconductor material bridging said pairs of spaced conductive areas to alter the same to said condition of much lower resistance.

7. The method of claim 6 wherein said energy is a single beam of energy selectively directed to the memory semiconductor material between selected pairs of said spaced conductive areas.

8 The method of claim 1 wherein said base is a semiconductor substrate and said components are a plurality of doped semiconductor device-forming regions in the substrate having terminals extending to different ones of said spaced conductive areas, only some of which semiconductor regions are useful in a circuit to be formed, and said energy being applied to said memory semiconductor material extending to said spaced conductive areas associated with the semiconductor regions to be used.

9. The method of claim 6 wherein said memory semiconductor material bridging said spaced conductive areas are different portions of the same film of memory semiconductor material extending over the between all of said spaced conductive areas.

10. The method of claim 1 wherein said spaced conductive areas are spaced apart a substantial distance, said energy being in the form of a beam of a size substantially less than the spacing between the conductive areas, the beam being moved along said memory semiconductor material between the spaced conductive areas to alter a continuous portion thereof between the spaced conductive areas to said condition of much lower resistance.

11. The method of claim 1 wherein said stable condition of much lower resistance of said memory semiconductor material is such a low resistance that the portion of the memory semiconductor material bridging said spaced conductive areas acts functionally like a wire interconnecting the same.

12. A method of forming electrical connections for a plurality of circuit components capable of forming at least two different electric circuits, said method comprising the steps of: providing a base with spaced conductive areas exposed on one side thereof which spaced conductive areas are points of an electrical circuit to include said circuit components some of whose terminals are to be electrically interconnected by connections between said spaced conductive areas; depositing on said base over and between said spaced conductive areas a film of memory semiconductor material in an initial substantially disordered generally amorphous condition of high resistance, the memory semiconductor material being resettably alterable from said initial substantially disordered generally amorphous condition of high resistance to a stable condition of much lower resistance and a different structure by the momentary impingement to the outer side thereof of external energy having a given material-setting characteristic and resettable back to said condition of high resistance by the momentary impingement on said outer side thereof of external energy having a given material-resetting characteristic, such condition of much lower resistance and reset condition of high resistance persisting indefinitely after the application of said energy is terminated, and altering only selected continuous portions of said memory semiconductor material between selected ones of the conductive areas to said stable condition of much lower resistance which low-resistance condition extends completely through said film of memory semiconductor material at least over said spaced conductive areas therebeneath, leaving unaltered other portions thereof, by the controlled selective application of said external energy to said outer side of said memory semiconductor material having said given material-setting characteristic of a magnitude which does not destroy the integrity of the memory semiconductor material thereat to form discrete conductive paths between said spaced conductive areas forming one of said electric circuits and leaving unaltered portions of said film of memory semiconductor material extending between circuit points forming said other electric circuit.

13. The method of claim 1 including the additional steps of providing said base with spaced conductive areas exposed on one side thereof with at least one resistor-forming deposit between said pair of said spaced conductive areas which deposit has a predetermined resistance gradient therealong proceeding from one end to the other end thereof, depositing a film of said memory semiconductor material between the last-mentioned pair of spaced conductive areas and overlying said resistance-forming deposit, and applying said external energy having said material-setting characteristic to said film of memory material between said last mentioned pair of spaced conductive areas to short circuit a length of said resistance-forming deposit, leaving unshortened a length of said resistance-forming deposit which supplies the desired value of resistance to the integrated circuit.

14. A method of forming electrical connection between a plurality of circuit components of a circuit-containing support base, the circuit components being connected to spaced circuit points on said support base, said method comprising the steps of: providing a base with spaced conductive areas exposed on one side thereof which spaced conductive areas are points of an electrical circuit to include said circuit components, depositing on said support base between said circuit points a film of memory semiconductor material of high resistance, said film of memory semiconductor material being resettably alterable from an initial substantially disordered generally amorphous condition of high resistance to a stable condition of much lower resistance and an altered structural state by the application thereto of an energy beam having a given material-setting characteristic and resettable back to said stable condition of high resistance by momentary application thereto of an energy beam having a given material-resetting characteristic, the condition of much lower resistance and reset condition of high resistance persisting indefinitely after the application of said energy beam is terminated, altering only selected portions of said memory semiconductor material between selected ones of the circuit points to said stable condition of much lower resistance by applying said energy beam having said material-setting characteristic to form discrete conductive paths between said circuit points, and subsequently resetting said lower resistance portions of said semiconductor material between certain ones of said circuit points to said condition of high resistance to disconnect the associated circuit components by applying said energy beam having said material-setting characteristic.

15. The method of claim 14 wherein said energy having said given material-setting characteristic is a beam of energy applied to a point of the memory semiconductor material for a relatively long duration, said energy having said given material-resetting characteristic is a beam of energy applied to a point of the memory semiconductor material for a relatively short duration.

16. The method of claim 12 including the further step of applying energy having said given material-resetting characteristics to portions of said film of memory semiconductor material in said stable low-resistance condition extending between at least some of said circuit points to reset the same to said condition of high resistance and applying said energy having said given material-setting characteristic to portions of said film of memory semiconductor material in said high-resistance condition extending between other of said circuit points to form a new pattern of discrete low-resistance conductive paths between said circuit points to form said other of said electrical circuits.

17. The method of claim 1 wherein said circuit points are immediately below the inner face of the film of memory semiconductor material, and said application of energy having said material-setting characteristic to said film of memory semiconductor material causes the energy to penetrate through the entire thickness thereof where said circuit points are located to effect electrical connection of said circuit points.

* * * * *